United States Patent
Kusumi et al.

(10) Patent No.: US 6,984,783 B2
(45) Date of Patent: Jan. 10, 2006

(54) POWER CONTROL UNIT FOR A VEHICLE

(75) Inventors: Hidetoshi Kusumi, Nagoya (JP);
Katsunori Yagi, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 420 days.

(21) Appl. No.: 10/157,085

(22) Filed: May 30, 2002

(65) Prior Publication Data

US 2003/0057705 A1 Mar. 27, 2003

(30) Foreign Application Priority Data

Jun. 15, 2001 (JP) .................................. 2001-182325

(51) Int. Cl.
*H02P 9/00* (2006.01)
*B60R 16/02* (2006.01)

(52) U.S. Cl. ............... 174/50; 174/17 R; 290/40 C; 290/40 F; 180/2.1

(58) Field of Classification Search ............ 174/50, 174/51, 52.4, 53, 59, 17 R, 72 A, 135, 112; 220/3.2, 3.8, 4.02, 3.92; 439/76.1, 76.2; 290/40 C, 290/40 F, 48, 27, 28, 34, 36 R, 40 R; 180/2.1, 180/154.1, 65.1, 65.2, 65.3, 65.4, 65.5; 322/24, 322/28, 25

See application file for complete search history.

(56) References Cited

U.S. PATENT DOCUMENTS

| 4,997,994 | A | * | 3/1991 | Andrews et al. ............ 174/112 |
|---|---|---|---|---|
| 5,513,719 | A | * | 5/1996 | Moroto et al. ............ 180/65.4 |
| 5,589,743 | A | * | 12/1996 | King .......................... 180/65.4 |
| 5,783,872 | A | | 7/1998 | Blair |
| 5,862,774 | A | * | 1/1999 | Moss ......................... 174/112 |
| 5,965,991 | A | * | 10/1999 | Koike et al. ................ 318/139 |
| 6,000,912 | A | | 12/1999 | Takada et al. |
| 6,161,278 | A | * | 12/2000 | Easter et al. ................... 29/749 |
| 6,202,776 | B1 | | 3/2001 | Masberg et al. |
| 6,488,107 | B1 | * | 12/2002 | Ochiai et al. .............. 180/65.2 |
| 6,522,034 | B1 | | 2/2003 | Nakayama |
| 6,578,649 | B1 | * | 6/2003 | Shimasaki et al. ......... 180/65.2 |
| 6,596,942 | B2 | * | 7/2003 | Ito et al. ................... 174/72 A |
| 6,602,157 | B2 | * | 8/2003 | Kashiwase ..................... 475/5 |
| 6,617,704 | B2 | * | 9/2003 | Tomikawa ............... 290/40 C |
| 6,661,109 | B2 | * | 12/2003 | Fukasaku et al. ......... 290/40 C |
| 6,701,880 | B1 | * | 3/2004 | Gauthier et al. .......... 290/30 R |

FOREIGN PATENT DOCUMENTS

| EP | 0 768 592 A1 | 4/1997 |
|---|---|---|
| JP | A 2000-152470 | 5/2000 |
| JP | A 2000-253511 | 9/2000 |
| JP | A 2000-253514 | 9/2000 |
| JP | 2001-78356 A | 3/2001 |

* cited by examiner

*Primary Examiner*—Chau N. Nguyen
*Assistant Examiner*—Angel R. Estrada
(74) *Attorney, Agent, or Firm*—Oliff & Berridge PLC

(57) ABSTRACT

A power control unit installed on a vehicle including a first power source and a second power source which have respective different voltages, an inverter connected to a rotary device and connected to at least one of the first and second power sources. A converter is connected to the first and second power sources. A casing is formed of an electrically conductive material and has a grounding terminal formed thereon, wherein the inverter and the converter are accommodated within the casing, and are connected to the grounding terminal through said casing.

25 Claims, 7 Drawing Sheets

POWER CONTROL UNIT FOR A VEHICLE

INCORPORATION BY REFERENCE

The disclosure of Japanese Patent Application No. 2001-182325 filed on Jun. 15, 2001, including the specification, drawings and abstract, is incorporated herein by reference in its entirety.

BACKGROUND OF THE INVENTION

1. Field of Invention

The present invention relates to a vehicle having two power sources having respective different voltages, an inverter and a converter, and more particularly to a vehicle power control unit wherein the inverter and the converter are unitized.

2. Description of Related Art

In known electric and hybrid vehicles, two power sources having respective different voltages, an inverter and a converter are provided. In the electric and hybrid vehicles of this type, the inverter and the converter are usually integral to improve the ease of installation on the vehicle and servicing or other working operations.

In the known electric and hybrid vehicles, grounding wires for the inverter and converter are provided independently of each other, and are electrically connected to the vehicle body, for the inverter and converter to be separately earthed. This grounding arrangement tends to complicate a wiring system, with a relatively large number of components, undesirably causing an increase in the cost of manufacture of the power control unit and deterioration in the ease of servicing of the power control unit.

SUMMARY OF THE INVENTION

It is an object of the present invention to reduce an increase in the cost of manufacture and deterioration in the ease of servicing of a power unit of a vehicle which includes two power sources having respective different voltages, an inverter and a converter.

The object indicated above may be achieved according to one aspect of this invention, which provides a power control unit to be installed on a vehicle including (a) a first power source and (b) a second power source which have respective different voltages, (c) an inverter to be connected to a rotary device and at least one of the first and second power sources, and (d) a converter to be connected to the first and second power sources. The power control unit has a casing in which the inverter and the converter are accommodated. The casing is formed of an electrically conductive material and has a grounding terminal formed thereon. The inverter and the converter are connected to the grounding terminal through the casing.

In the vehicle power controlled unit constructed as described above, the inverter and the converter are connected to the common grounding terminal through the casing formed of the electrically conductive material. Accordingly, the inverter and converter need not be earthed to the vehicle body through respective separate grounding wires. This arrangement makes it possible to reduce the number of components and the cost of manufacture of the power control unit, simplify its wiring system, and improving the ease of servicing or other working operations on the power control unit.

According to another aspect of the present invention, there is provided a power control unit for a vehicle, which is electrically connected to a first power source having a nominal voltage of 12V and a second power source having a nominal voltage of 36V, said power control unit having a casing in which an inverter and a converter are accommodated. A first electric wire connecting each of at least one of the inverter and the converter to the first power source, and a second electric wire connecting at least one of the inverter and the converter to the second power source have respective outer coatings having respective different colors is provided. The outer coating of the second wire can have a yellow color, e.g., a bright yellow color.

In the power control unit according to the second aspect of this invention, the outer coatings of the first and second electric wires are differently colored, for easy distinction between those first and second wires, such that the ease of servicing of the power control unit is improved.

Usually, an electric wire having an orange-colored outer coating is used to indicate that an exposure to the voltage of the electric wire is seriously harmful to the human body. On the other hand, an exposure to the voltage of the second electric wire connected to the second power source having the comparatively high nominal voltage is not as seriously harmful to the human body, but is still hazardous to the human body. Thus, the outer coating of the second electric wire is bright-yellow colored, to clearly inform the worker that the exposure to the voltage of the second electric wire is not as seriously harmful to the human body but is still hazardous to the human body.

BRIEF DESCRIPTION OF THE DRAWINGS

The above and other objects, features, advantages, technical and industrial significance of this invention will be better understood by reading the following detailed description of an exemplary embodiment of the invention, when considered in connection with the accompanying drawings, in which.

DETAILED DESCRIPTION OF EXEMPLARY EMBODIMENTS

In the following description and the accompanying drawings, one exemplary embodiment of the present invention will be described in more detail.

Figure 1:
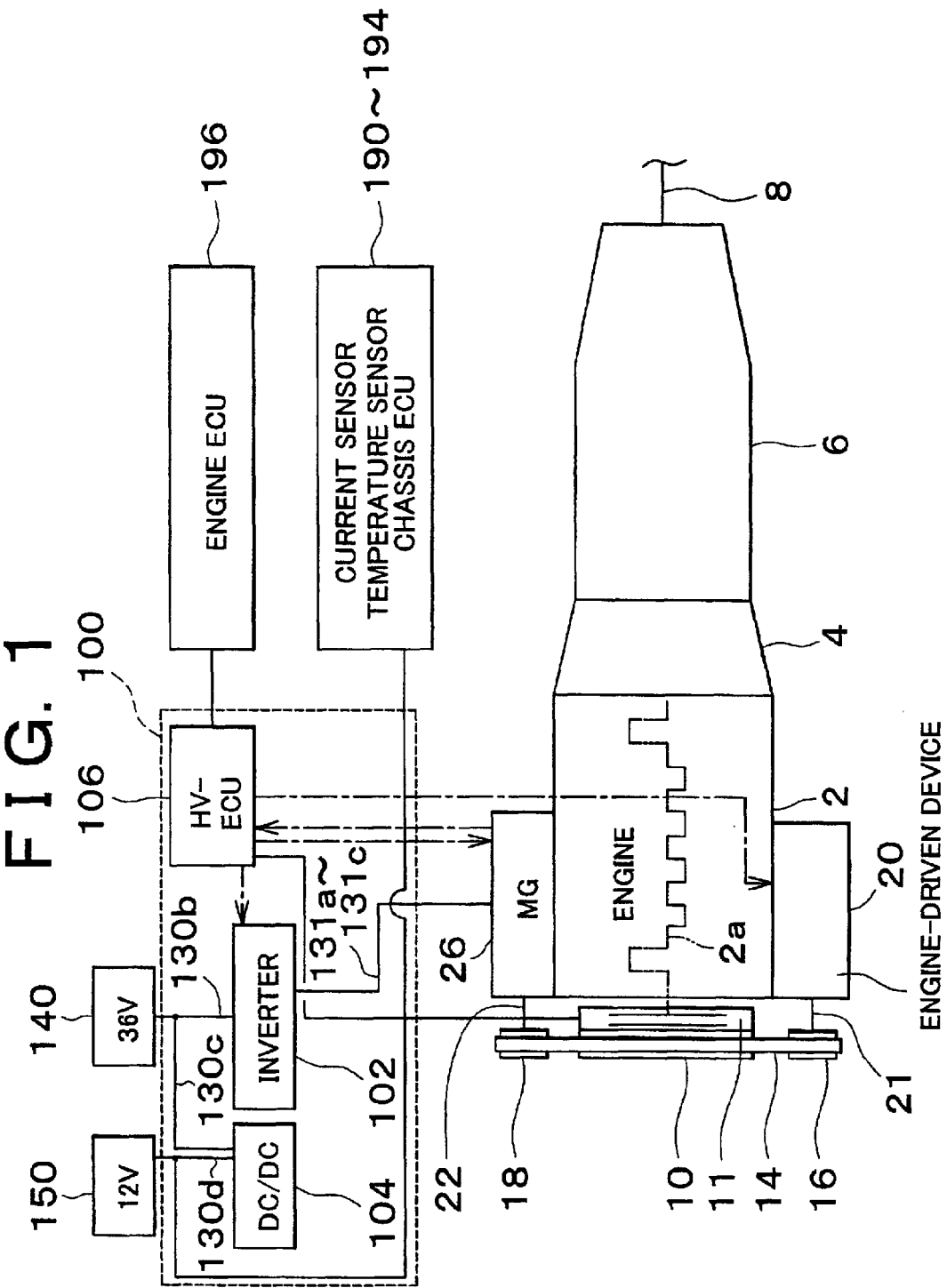
FIG. 1 is a schematic system view of an automotive vehicle including a power control unit 100 according to one embodiment of this invention.
Figure 2:
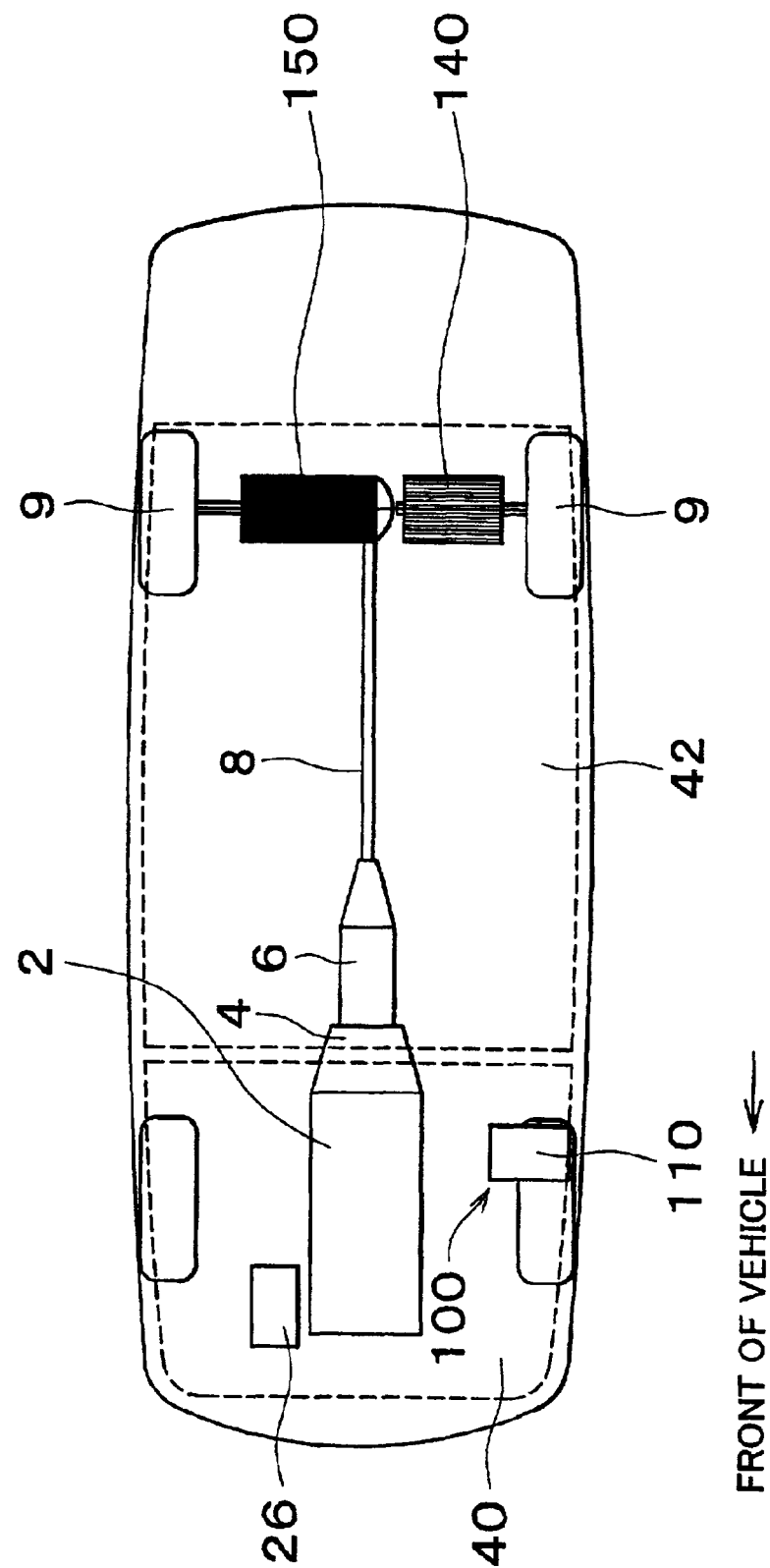
FIG. 2 is a view illustrating various components installed on the vehicle of FIG. 1.

FIGS. 1 and 2 illustrate a schematic system view of an automotive vehicle comprising an engine 2 an output of which is transmitted to drive wheels 9 through a torque converter 4, an automatic transmission 6 and an output shaft 8. The output of the engine 2 is also transmitted to a belt 14 via a damper pulley 10 which is connected to a crankshaft 2a and incorporates an electromagnetic clutch 11. The belt 14 connects the damper pulley 10 to two pulleys 16, 18, for rotating these pulleys 16, 18. The electromagnetic clutch 11 incorporated within the damper pulley 10 is selectively placed in its engaged and released states, as needed, to connect and disconnect the pulley 10 to and from the crankshaft 2*a*.

The pulley 16 is connected to a rotary shaft 21 of an engine-driven device 20, so that the engine-driven device 20 is operated by a rotary drive force transmitted through the belt 14. The engine-driven device 20 may comprise at least one of a compressor for an air conditioning system, a power steering pump, and an engine cooling water pump, for instance.

The pulley 18 is connected to a rotary shaft 22 of a motor/generator 26 (hereinafter abbreviated as "MG"), which is one form of a rotary device. The MG 26 functions as an electric generator, as needed, so that a rotary drive force received from the engine 2 through the pulley 18, or from the vehicle drive wheels 9, is converted into an electric energy by the MG 26. The MG 26 also functions as an electric motor, as needed, to rotate one or both of the crankshaft 2*a* and the rotary shaft 21 of the engine-driven device 20, through the rotating shaft 22, pulley 18 and the belt 14. The MG 26 is a three-phase AC motor/generator.

The vehicle has a power control unit 100, which includes an inverter 102, a DC/DC converter 104, and an electronic hybrid control unit 106 (hereinafter abbreviated as "HV-ECU"). The inverter 102 and the MG 26 are electrically connected to each other through power wires 131*a*, 131*b* and 131*c*, while the inverter 102 and a second power source in the form of a high-voltage DC power source 140 (e.g., having a nominal voltage of 36V) are electrically connected to each other through a power wire 130*b*. The DC/DC converter 104 is electrically connected to the inverter 102 and the high-voltage DC power source 140 through a power wire 130*c*, and further to a first power source in the form of a low-voltage power source 150 (e.g., having a nominal voltage of 12V) through a power wire 130*d*. The outer coatings of the power wires 131*a*, 131*b*, 131*c*, 130*b* and 130*c* are a bright yellow color, while that of the power wire 130*d* is a black color.

When the MG 26 functions as the electric generator, the inverter 102 under the control of the HV-ECU 106 performs a switching action for controlling the voltage and amount of energy generated by the MG 26, to charge the high-voltage DC power source 140 with the electric energy generated by the MG 26. At the same time, the charging of the low-voltage DC power source 150 is also effected through the DC/DC converter 104.

While the MG 26 is not generating an electric energy, the electric power is supplied from the high-voltage DC power source 140 to the low-voltage DC power source 150, since these two power sources 140, 150 are electrically connected to each other.

When the MG 26 functions as the electric motor, the inverter 102 under the control of the HV-ECU 106 permits the electric power to be supplied from the high-voltage DC power source 140 to the MG 26.

The HV-ECU 106 is arranged to effect automatic engine stopping and starting controls, as well to control the inverter 102. That is, the HV-ECU 106 automatically turns off the engine 2 when a predetermined engine-stopping condition is satisfied, and automatically starts the engine 2 when a predetermined engine-starting condition is satisfied. To effect the automatic engine starting control, the HV-ECU 106 places the electromagnetic clutch 11 incorporated in the pulley 10, in its engaged state, and controls the inverter 102 so as to supply the electric power from the high-voltage DC power source 140 to the MG 26 as described above, for driving the MG 26 to crank the engine 2. In the automatic engine stopping control, the HV-ECU 106 holds the electromagnetic clutch 11 in its released state, and control the inverter 102 so as to supply the electric power from the high-voltage DC power source 140 to the MG 26 as described above, for driving the MG 26 to operate the engine-driven device 20.

FIG. 2 describes an exemplary arrangement of the various components installed on the vehicle.

The power control unit 100 has a unit casing 110. The power control unit 100 is disposed in a part of an engine room 40 which is relatively near a passenger or occupant compartment 42. The unit casing 110 is dimensioned such that the unit casing 110 can be mounted on a battery tray (not shown) which is similar to that used to install a DC 12V power source used on a known vehicle which uses only the 12V power source device as its electric power source device. The unit casing 110 is mounted on this battery tray in the present vehicle.

On the other hand, the high-voltage DC power source 140 and the low-voltage DC power source 150 are installed in a rear part of the vehicle.

Figure 3:
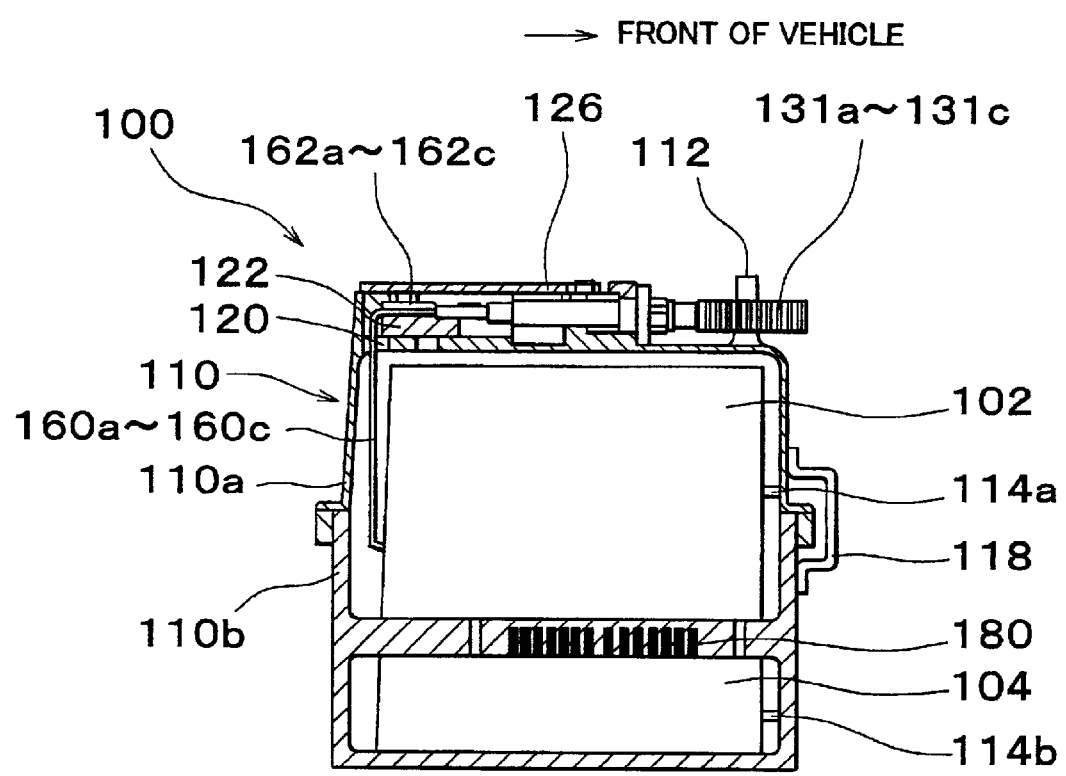
FIG. 3 is an elevational view in vertical cross section of the power control unit 100 on the vehicle.
Figure 4:
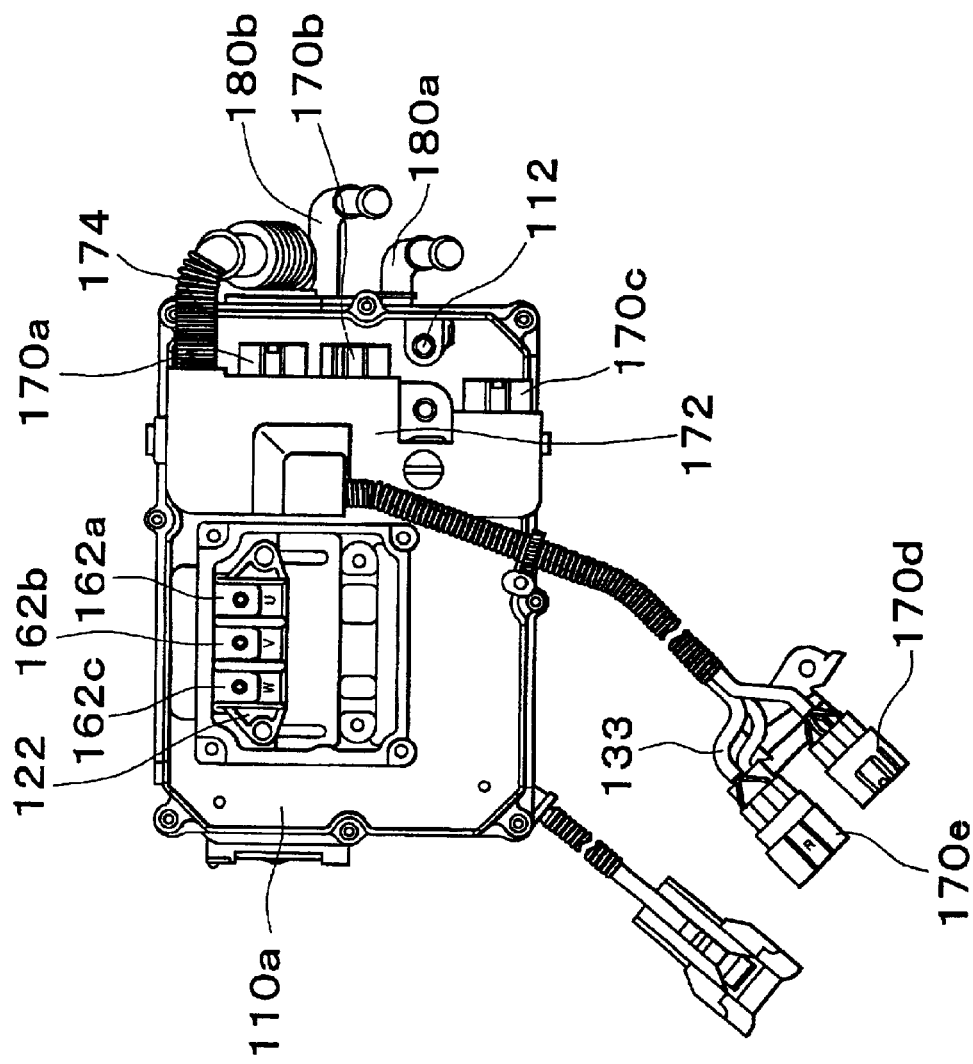
FIG. 4 is a plan view of the power control unit 100 with its cover 126 being removed.
Figure 5:
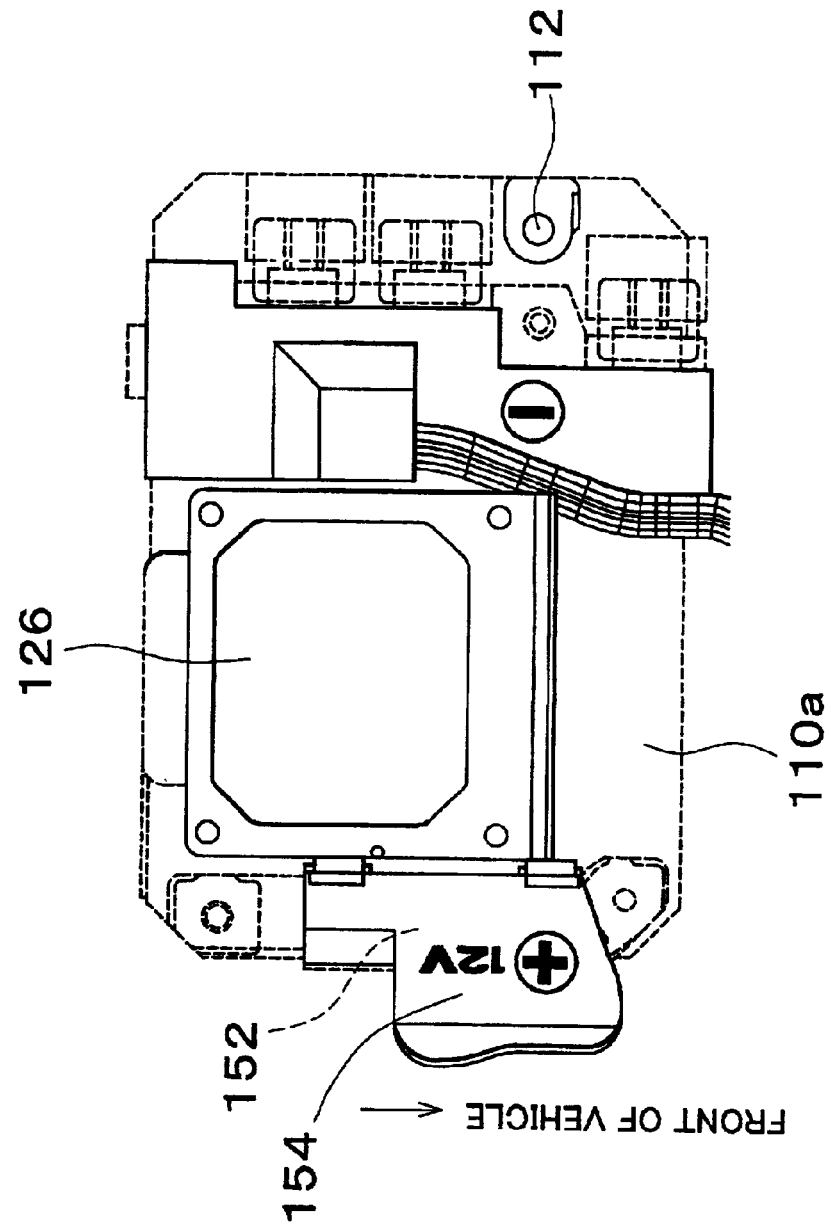
FIG. 5 is a plan view of the power control unit 100 with the cover 126 installed thereon.
Figure 6:
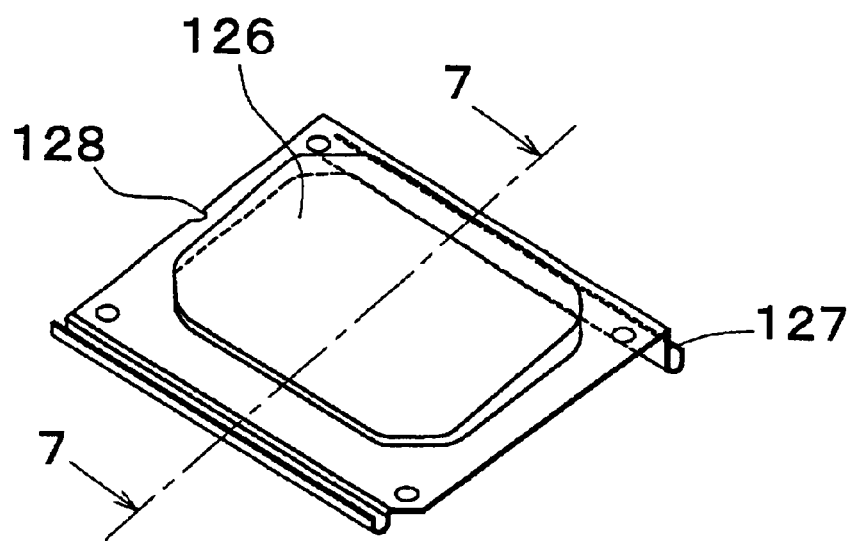
FIG. 6 is a perspective view of the cover 126.
Figure 7:
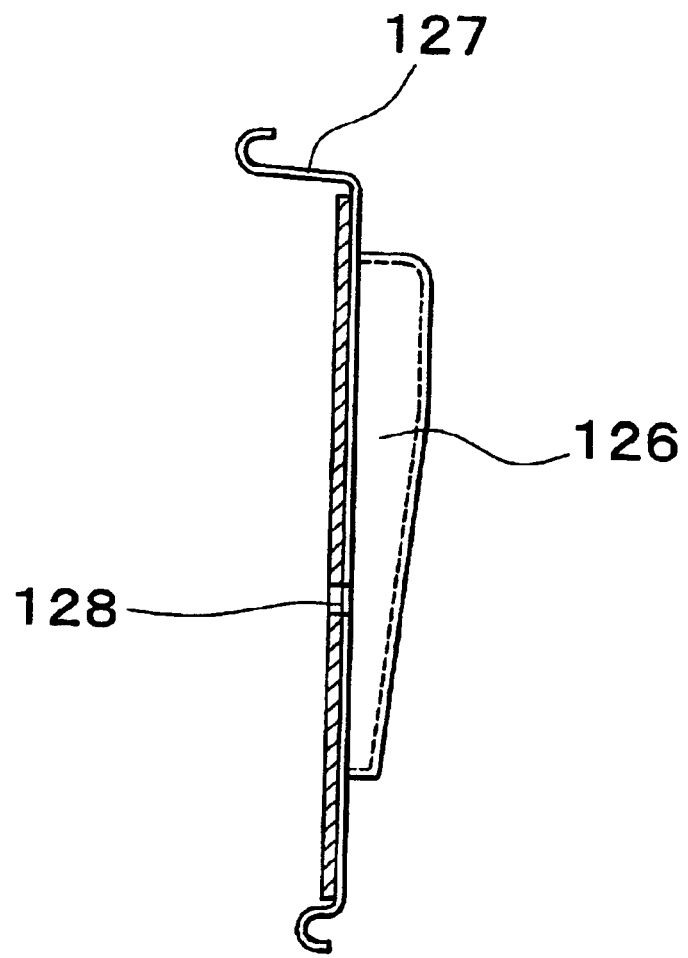
FIG. 7 is a cross sectional view taken along line 7—7 of FIG. 6.

The construction of the power control unit 100 will be described in detail, by reference to FIGS. 3–7. FIG. 3 is an elevational view in vertical cross section of the power control unit 100 according to the present embodiment. FIG. 4 is a plan view of the power control unit 100 with its cover 126 being removed. FIG. 5 is a plan view of the power control unit 110 with its cover 126 being installed thereon. FIG. 6 is a perspective view of the cover 126, while FIG. 7 is a cross sectional view taken along line 7—7 of FIG. 6.

The unit casing 110 consists of an upper casing portion 110*a* and a lower main body portion 110*b*, which are formed of a metallic electrically conductive material. The upper casing portion 110*a* is removably fixed to the main body portion 110*b* such that the upper casing portion 110*a* extends upright from the main body portion 110*b*. The upper casing portion 110*a* and the main body portion 110*b* are electrically connected to each other by a metallic bus bar 118, which is connected at its one end to the outer surface of the upper casing portion 110*a* and at the other end to the outer surface of the main body portion 110*b*. On the upper surface of the upper casing portion 110*a*, a common grounding terminal 112 is formed integrally with the upper casing portion 110*a*.

Within the unit casing 110, the DC/DC converter 104 is disposed under the inverter 102. The inverter 102 has a negative terminal connected to the upper casing portion 110*a* through a contactor 114*a*, while the DC/DC converter 104 has a negative terminal connected to the main body portion 110*b* through a contactor 114*b*. As described above, the upper casing portion 110*a* having the integrally formed grounding terminal 112 and the main body portion 110*b* are electrically connected to each other, so that the inverter 102 and the DC/DC converter 104 are electrically connected to the common grounding terminal 112 through the unit casing 110. The common grounding terminal 112 is connected through a suitable conductor (not shown) to the body of the vehicle, so that the inverter 102 and the converter 104 are earthed.

Each of three substantially L-shaped bus bars 160*a*, 160*b* and 160*c* (corresponding to U, V and W phases, respectively) is connected at its one end to the inverter 102, and the other end portion of each bus bar 160*a*, 160*b*, 160*c* passes through an opening 120 formed through the top wall of the upper casing portion 110a, and extends laterally of the unit casing 110 towards the front of the vehicle, so as to function as a terminal portion 162a, 162b, 162c (corresponding to the U, V and W phases, respectively). To the terminal portions 162a, 162b and 162c, there are connected the respective power wires 131a, 131b and 131c corresponding to the U, V and W phases of a stator coil (not shown) of the MG 26, so that the inverter 102 is connected to the MG 26.

The opening 120 formed through the top wall of the upper casing portion 110a has an area of opening larger than a sum of surface areas of the terminal portions 162a, 162b, 162c as viewed in the vertical direction, so that the terminal portions 162a, 162b, 162c can pass through the opening 120 when the upper casing portion 110a is removed from the main body portion 110b.

The terminal portions 162a, 162b, 162c are supported by a terminal support plate 122, which is disposed on the upper surface of the upper casing portion 110a such that the terminal support plate 122 is slidably movable on the upper surface of the upper casing portion 110a and closes the opening 120.

To the upper casing portion 110a, there is fixed a cover 126 which includes a horizontally extending portion that extends over and covers the terminal portions 162a, 162b, 162c. As shown in FIGS. 6 and 7, the cover 126 has a projection 127, and a recess 128 for engagement with a protrusion formed on the upper casing portion 110a. These projection 127 and recess 128 prevent erroneous positioning of the cover 126 relative to the upper casing portion 110a.

As shown in FIG. 5, a positive terminal 152 for the low-voltage DC power source 150 is fixed to the upper surface of the upper casing portion 110a, such that the positive terminal 152 is covered by a terminal cover 154. To inform the worker that the positive terminal 152 is for the low-voltage DC power source 150 having the nominal voltage of 12V, the upper surface of the terminal cover 154 is provided with an indication "+12V".

Between the inverter 102 and the DC/DC converter 104, there is provided cooling means in the form of a cooling water passage 180 communicating with an inlet pipe 180a and an outlet pipe 180b, so that cooling water introduced through the inlet pipe 180a flows through the cooling water passage 180 and is discharged through the outlet pipe 180b.

The power control unit 100 is provided with connectors 170a, 170b, 170c and 170d for connection with various components installed on the vehicle, such as a current sensor 190, a temperature sensor 192, a chassis ECU 194 and an engine ECU 196 (shown in FIG. 1). Since the current sensor 190, temperature sensor 192 and chassis ECU 194 have the same operating voltage of 12V, the corresponding connectors 170a–170c are accommodated within a one-piece casing 172. This one-piece casing 172 is removably attached to the upper surface of the upper casing portion 110a. A harness 174 which connects the interior of the power control unit 100 and the one-piece casing 172 extends through one of side walls of the main body portion 110b, as indicated in FIG. 4, and a portion of the harness 174 is located within the power control unit 100.

A connector 170e is provided to connect a field magnet circuit within the power control unit 100 and coil windings wound on the rotor of the MG 26. The outer coating of a power wire 133 connected to the connector 170e has a bright yellow (or golden yellow) color.

The upper casing portion 110a functions as a first casing member while the main body portion 110b functions as a second casing member.

The present embodiment of the invention described above has the following advantages:

(1) Both, the inverter 102 and the converter 104 are connected to the common grounding terminal 112 through the unit casing 110 formed of the electrically conductive material. Accordingly, the inverter 102 and converter 104 need not be earthed to the vehicle body through respective separate grounding wires. This arrangement makes it possible to reduce the number of components and the cost of manufacture of the power control unit 100, simplify its wiring system, and improve the ease of servicing or other working operations on the power control unit 100.

(2) While the inverter 102 and converter 104 generate heat during operations and need to be cooled, this cooling can be achieved by the cooling water passage 180 provided between the inverter 102 and converter 104. Thus, the cooling structure is simplified.

(3) The grounding terminal 112 formed on the upper surface of the unit casing 110 permits easy servicing or other working operations on the power control unit 100.

(4) The terminal portions 162a–162c disposed on the upper surface of the unit casing 110 permit easy operation to connect the terminal portions 162a–162c and the power wires 131a–131c.

(5) Since the terminal portions 162a–162c slightly project upwards from the upper surface of the unit casing 110, the ease of connection of the terminal portions 162a–162c to the power wires 131a–131c is further improved. In addition, the terminal portions 162a–162c extending laterally of the unit casing 110 prevents a large vertical distance between the upper surface of the unit casing 100 and the corresponding end portions of the power wires 131a–131c connected to the terminal portions 162a–162c, so that the structure including and located around the terminal portions 162a–162c can be made relatively compact, while permitting easy electrical connection between the terminal portions 162a–162c and the power wires 131a–131c.

(6) The unit casing 110 cosists of the upper casing portion 110a and the main body portion 110b. The upper casing portion 110a can be removed from the main body portion 110b in the vertical direction, facilitating the servicing or maintenance of the power control unit 100. When the upper casing portion 110a is fixed and removed to and from the main body portion 110b, the terminal support plate 122 supporting the terminal portions 162a–162c is slidably moved on the upper surface of the upper casing portion 110a from the original position in which the opening 120 is closed by the terminal support plate 122, to a position in which the opening 120 is open so that the terminal portions 162a–162c can pass through the opening 120 when the upper casing portion 110a is fixed and removed. Thus, the fixing and removal of the upper casing portion 110a can be made without an interference with the terminal portions 162a–162c. When the upper casing portion 110a is attached to the main body portion 110b, the terminal support plate 122 is slidably moved on the upper surface of the upper casing portion 110a, laterally of the unit casing 110, so that after the attachment of the upper casing portion 110a, the terminal portions 162a–162c are supported on the terminal support plate 122 while the opening 120 is closed by the terminal support plate 122, to prevent entry of foreign matters or water into the unit casing 100 through the opening 120. Thus, a simple movement of the terminal support plate 122 makes it possible to support the terminal portions 162a–162c and close the opening 120.

(7) The connectors 170a–170c for connecting the various components of the vehicle to the power control unit 100 are accommodated within the one-piece casing 172, so that the power control unit 100 can be made compact and can be easily serviced. Further, the one-piece casing 172 is removable from the unit casing 110 so that the upper casing portion 110a can be easily removed. The ease of servicing of the power control unit 100 is further improved since the connectors 170a–170c accommodated within the one-piece casing 172 are to be connected to the components having the same operating voltage.

(8) The cover 126 is prevented from being erroneously oriented with respect to the upper casing portion 110a because the projection 127 and the recess 128 are engaged with the protrusion formed on the upper casing portion 110a.

(9) The unit casing 110 is dimensioned so that the unit casing 110 can be mounted on the battery tray provided in a laterally end portion of the engine room of the vehicle. This arrangement is effective to minimize a required change of design of the engine room of the present vehicle having the two electric power sources, with respect to the engine room of a vehicle having a single electric power source.

(10) The positive terminal 152 of the low-voltage DC power source 150 (having the nominal voltage of 12V) is fixed to the unit casing 110, so that when the engine of the present vehicle is started with a jumper cable connecting the positive terminal 152 to a 12V DC battery on another vehicle, the worker can find the positive terminal 152 without difficulty.

(11) The outer coatings of the power wires in the nominal 12V power source system and those in the nominal 36V power source system are differently colored, for easy distinction between those power wires in the two systems, such that the ease of servicing of the power control unit 100 is improved. The outer coatings of the power wires 131a–131c, 130b, 130c and 133 used in the nominal 36V power source system have a bright yellow (or golden yellow) color to clearly identify to the worker that an exposure to the voltage of those power wires is not seriously harmful to the human body, but is more or less hazardous to the human body.

In the exemplary embodiment described above, the upper casing portion 110a and the main body portion 110b are electrically connected to each other through the bus bar 118. However, the exemplary embodiment can be modified in the following manner. The bus bar 118 may be replaced by metallic contactor portions provided at the junction between the upper casing and main body portions 110a, 110b, which portions are arranged to directly contact each other. In this case, the junction may consist of the metallic contactor portion and a sealing portion arranged to secure fluid tightness between the upper casing and main body portions 110a, 110b. This arrangement permits electrical continuity between the upper casing and main body portions 110a, 110b, without using any exclusive members such as, e.g., the bus bar indicated above.

In the illustrated embodiment, the controller (the HV-ECU 106) is implemented as a programmed general purpose electronic control unit. It will be appreciated by those skilled in the art that the controller can be implemented using a single special purpose integrated circuit (e.g., ASIC) having a main or central processor section for overall, system-level control, and separate sections dedicated to performing various different specific computations, functions and other processes under control of the central processor section. The controller can be a plurality of separate dedicated or programmable integrated or other electronic circuits or devices (e.g., hardwired electronic or logic circuits such as discrete element circuits, or programmable logic devices such as PLDs, PLAs, PALs or the like). The controller can be implemented using a suitably programmed general purpose computer, e.g., a microprocessor, microcontroller or other processor device (CPU or MPU), either alone or in conjunction with one or more peripheral (e.g., integrated circuit) data and signal processing devices. In general, any device or assembly of devices on which a finite state machine capable of implementing the procedures described herein can be used as the controller. A distributed processing architecture can be used for maximum data/signal processing capability and speed.

While the invention has been described with reference to preferred embodiments thereof, it is to be understood that the invention is not limited to the preferred embodiment or constructions. To the contrary, the invention is intended to cover various modifications and equivalent arrangements. In addition, while the various elements of the preferred embodiment are shown in various combinations and configurations, which are exemplary, other combinations and configurations, including more, less or only a single element, are also within the spirit and scope of the invention.

What is claimed is:

1. A power control unit that is installed on a vehicle including (a) a first power source and (b) a second power source which have respective different voltages, (c) an inverter to be connected to a rotary device and at least one of said first and second power sources, and (d) a converter to be connected to said first and second power sources, said power control unit comprising:
    a casing formed of an electrically conductive material and having a grounding terminal formed thereon,
    wherein said inverter and said converter are accommodated within said casing, and connected to said grounding terminal through said casing.

2. A power control unit according to claim 1, wherein said grounding terminal is formed integrally with said casing.

3. A power control unit according to claim 1, wherein said converter is located below said inverter within said casing.

4. A power control unit according to claim 1, further comprising a cooling device provided between said inverter and said converter.

5. A power control unit according to claim 1, wherein said grounding terminal is formed on an upper surface of said casing.

6. A power control unit according to claim 1, wherein said casing comprises:
    a first casing member having said grounding terminal; and
    a second casing member, wherein:
        at least one of said inverter and said converter is connected to said second casing member; and
        said first and second casings members are fixed and electrically connected to each other.

7. A power control unit according to claim 6, wherein said inverter is connected to said first casing member, and said converter is connected to said second casing member.

8. A power control unit according to claim 6, wherein said first and second casing members are electrically connected to each other through a bus bar fixed to outer surfaces of said first and second casing members.

9. A power control unit according to claim 6, wherein each of said first and second casing members has a sealing portion and a metallic contactor portion at a junction between the first and second casing members.

10. A power control unit according to claim 1, wherein windings of said rotary device and said inverter are connected to each other through power wires, and terminal portions to which said power wires are connected are disposed on an upper surface of said casing.

11. A power control unit according to claim 10, wherein said terminal portions project from said upper surface of said casing, and then extend laterally of said casing.

12. A power control unit according to claim 11, wherein said casing includes of a main body portion and an upper casing portion which is removably fixed to said main body portion in a direction perpendicular to said upper surface, and said upper casing portion includes an upper wall having an opening which permits said terminal portions to pass therethrough when said upper casing portion is fixed and removed to and from said main body portion.

13. A power control unit according to claim 12, further comprising a terminal support plate which is disposed on the upper surface of said upper casing portion such that said terminal support plate normally supports said terminal portions and extends across said opening, said terminal support plate being slidably movable on the upper surface of said upper casing portion laterally of said upper casing portion.

14. A power control unit according to claim 13, wherein said terminal support plate is dimensioned to close said opening.

15. A power control unit according to claim 10, wherein said rotary device is a three-phase AC motor/generator, and said terminal portions comprise terminal portions corresponding to respective coil windings of three phases of said motor/generator.

16. A power control unit according to claim 10, further comprising a cover member fixed to said casing, said cover member including a portion which extends over and covers said terminal portions, said cover member having a projection and a recess for positioning said cover member relative to said casing.

17. A power control unit according to claim 1, wherein said casing is installed within an engine compartment of the vehicle.

18. A power control unit according to claim 17, wherein said casing is dimensioned such that said casing can be disposed on a battery tray located in said engine compartment.

19. A power control unit according to claim 18, wherein said first power source is a DC power source having a nominal voltage of 12V, and said second power source is a DC power source having a nominal voltage higher than 12V, and said casing has a positive terminal of said first power source fixed thereto.

20. A power control unit according to claim 17, wherein said casing is disposed in a portion of the engine compartment of the vehicle, which is near a passenger compartment of the vehicle.

21. A power control unit according to claim 1, further comprising a one-piece casing fixed to said casing, and connectors to be respectively connected to a plurality of components installed on the vehicle, and wherein said connectors are accommodated within said one-piece casing.

22. A power control unit according to claim 21, wherein said one-piece casing is removably fixed to said casing.

23. A power control unit according to claim 21, wherein the operating voltages of said plurality of components are different and said connectors to be connected to said components having the same operating voltage are accommodated within said one-piece casing.

24. A power control unit for a vehicle, which is electrically connected to a first power source having a nominal voltage of 12V and a second power source having a nominal voltage of 36V, comprising:

a casing;

an inverter accommodated within said casing;

a converter accommodated within said casing;

a first electric wire connecting at least one of said inverter and said converter to said first power source having a nominal voltage of 12V; and a second electric wire connecting at least one of said inverter and said converter to said second power source having a nominal voltage of 36V, wherein said first and second electric wires have respective outer coatings having respective different colors, the outer coating of said second electric wire is a yellow color.

25. A power control unit according to claim 24, wherein the outer coating of the second electric wire is a bright yellow color.

* * * * *